US012615926B2

(12) United States Patent
Choi et al.

(10) Patent No.: US 12,615,926 B2
(45) Date of Patent: Apr. 28, 2026

(54) DISPLAY APPARATUS

(71) Applicant: LG Display Co., Ltd., Seoul (KR)

(72) Inventors: Pyungho Choi, Seoul (KR); Hyunseok Na, Hwaseong-si (KR); JaeJun Ahn, Gumi-si (KR); Hyoungsun Park, Seoul (KR); Hyunchyol Shin, Seoul (KR); Seongsoo Cho, Seoul (KR)

(73) Assignee: LG Display Co., Ltd., Seoul (KR)

( * ) Notice: Subject to any disclaimer, the term of this patent is extended or adjusted under 35 U.S.C. 154(b) by 312 days.

(21) Appl. No.: 18/208,644

(22) Filed: Jun. 12, 2023

(65) Prior Publication Data

US 2024/0032351 A1 Jan. 25, 2024

(30) Foreign Application Priority Data

Jul. 21, 2022 (KR) ........................ 10-2022-0090409

(51) Int. Cl.
*H01L 29/417* (2006.01)
*H10D 30/67* (2025.01)
*H10K 59/126* (2023.01)

(52) U.S. Cl.
CPC ....... *H10K 59/126* (2023.02); *H10D 30/6723* (2025.01); *H10D 30/6729* (2025.01); *H10D 30/673* (2025.01); *H10D 30/6745* (2025.01); *H10D 30/6755* (2025.01)

(58) Field of Classification Search
CPC .............. H10D 30/6723; H10D 30/67; H10D 30/6729; H10D 30/673; H10D 30/6745; H10D 30/6755; H10D 86/481; H10D 86/40; H10D 86/423; H10D 86/60; H10K 59/1213; H10K 59/121; H10K 59/12; H10K 59/35; H10K 59/351; H10K 59/1216; H10K 59/131; H10K 59/126
See application file for complete search history.

(56) References Cited

U.S. PATENT DOCUMENTS

| | | | |
|---|---|---|---|
| 6,249,327 B1 * | 6/2001 | Murade | G02F 1/1368 438/30 |
| 10,978,538 B2 * | 4/2021 | Wang | H10K 59/131 |
| 2020/0066758 A1 | 2/2020 | Yang et al. | |
| 2020/0083309 A1 * | 3/2020 | Wang | H10D 86/60 |
| 2021/0119007 A1 * | 4/2021 | Misaki | H10D 64/62 |
| 2022/0085131 A1 | 3/2022 | Baek et al. | |

FOREIGN PATENT DOCUMENTS

| | | |
|---|---|---|
| KR | 10-2015-0048361 A | 5/2015 |
| KR | 10-2020-0029103 A | 3/2020 |
| KR | 10-2022-0036416 A | 3/2022 |

OTHER PUBLICATIONS

Ministry of Intellectual Property of Korea, Office Action, Korean Patent Application No. 10-2022-0090409, Dec. 16, 2025, 17 pages.

* cited by examiner

*Primary Examiner* — Nikolay K Yushin
(74) *Attorney, Agent, or Firm* — Fenwick & West LLP

(57) ABSTRACT

A display apparatus is disclosed. The display apparatus according to the present disclosure may include a substrate including an active area and a non-active area around the active area, a first shield layer disposed on the substrate, a first thin film transistor including a first semiconductor layer on the first shield layer, a first etch stopper on the first semiconductor layer, a second thin film transistor including a second semiconductor layer on the substrate, and a second etch stopper on the second semiconductor layer.

21 Claims, 11 Drawing Sheets

DISPLAY APPARATUS

CROSS-REFERENCE TO RELATED APPLICATION

This application claims the priority of Republic of Korea Patent Application No. 10-2022-0090409 filed on Jul. 21, 2022, in the Korean Intellectual Property Office, which is incorporated by reference in its entirety.

FIELD

The present disclosure relates to a display apparatus.

BACKGROUND ART

In accordance with the development of the information society, importance of a display apparatus for displaying images is increasing. In response to this, flat panel display apparatuses, such as a liquid crystal display and an organic light emitting display, are being commercialized. Among such display apparatuses, as a self-emitting device, the organic light emitting display which has a high response speed, a high luminance, and a wide viewing angle is currently widely being used. The organic light emitting display is not only formed on a flexible plastic substrate, but also can be driven at a low voltage, has relatively low power consumption, and has excellent colors.

In the organic light emitting display, a plurality of pixels are disposed in a matrix. Each pixel may be configured by a light emitting diode configured by an organic light emitting layer and a pixel circuit represented by a thin film transistor. There is a problem in that the thin film transistor is easily affected by surrounding voltages or static electricity, so that the characteristics of the thin film transistor are changed.

SUMMARY

An object of the present disclosure is to provide a structure in which a semiconductor pattern located in a lower portion in each pixel maintains and stably implements electrical characteristics of thin film transistors configured in the pixel.

Objects of the present disclosure are not limited to the above-mentioned objects, and other objects, which are not mentioned above, can be clearly understood by those skilled in the art from the following descriptions.

According to an aspect of the present disclosure, a display apparatus may include a substrate including an active area and a non-active area around the active area, a first shield layer disposed on the substrate, a first thin film transistor including a first semiconductor layer on the first shield layer, a first etch stopper on the first semiconductor layer, a second thin film transistor including a second semiconductor layer on the substrate, and a second etch stopper on the second semiconductor layer.

Other detailed matters of the exemplary embodiments are included in the detailed description and the drawings.

The display apparatus according to the present disclosure has the following effects. Processes for a contact of a driving transistor and a shield layer, and a contact for a switching transistor are simultaneously performed so that the number of processes is reduced, and the single contact during the contact with the shield layer is possible. Accordingly, precise and uniform contact can be provided so that a process margin is ensured and thin film transistors implement uniform performance to configure a stable pixel circuit part.

According to another aspect of the present disclosure, a display apparatus may include a substrate including an active area and a non-active area around the active area; a first shield layer disposed on the substrate; a first thin film transistor including a first semiconductor layer on the first shield layer, the first shield layer being connected to a source electrode of the first thin film transistor; a second thin film transistor including a second semiconductor layer on the substrate; a second shield layer between the substrate and the second semiconductor layer, the second shield layer being connected to a source electrode of the second thin film transistor; and a third thin film transistor disposed on the substrate and including a third semiconductor layer.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
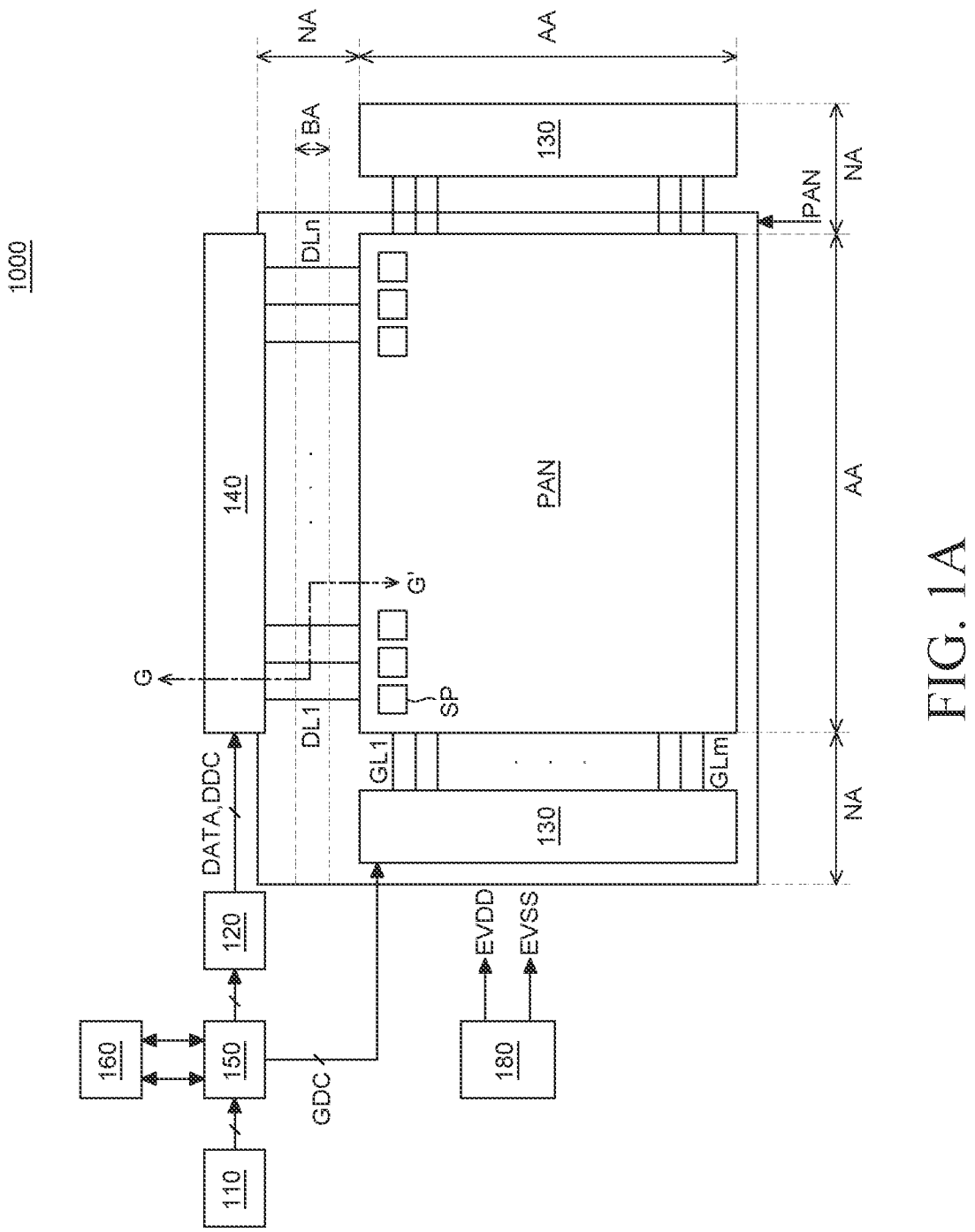
FIG. 1A is a view of a display apparatus according to one embodiment of the present disclosure.

Terminologies used in exemplary embodiments of the present specification are selected from general terminologies which are currently and widely used as much as possible while considering a function in the present specification, but the terminologies may vary in accordance with the intention of those skilled in the art, custom, or appearance of new technology. Further, in particular cases, the terms are arbitrarily selected by an applicant and in this case, the meaning thereof may be described in a corresponding section of the description of the disclosure in detail. Therefore, the term used in the specification needs to be defined based on a substantial meaning of the term and the specification rather than a simple title of the term.

In the specification, unless explicitly described to the contrary, the word "comprise" and variations such as "comprises" or "comprising", will be understood to imply the inclusion of stated elements but not the exclusion of any other elements.

The expression "at least one of a, b, and c" described throughout this specification includes 'a alone', b alone', 'c alone', 'a and b', 'a and c', 'b and c', or 'all a, b, and c'. Advantages and characteristics of the present disclosure and a method of achieving the advantages and characteristics will be clear by referring to exemplary embodiments described below in detail together with the accompanying drawings.

The shapes, sizes, ratios, angles, numbers, and the like illustrated in the accompanying drawings for describing the exemplary embodiments of the present disclosure are merely examples, and the present disclosure is not limited thereto. In description of an example embodiment, if it is determined that detailed description for a related art may unnecessarily obscure the gist of the example embodiment, the detailed description will be omitted.

The terminologies such as "including," "having," and "consist of" used herein are generally intended to allow other components to be added. Any references to singular may include plural unless expressly stated otherwise. Components are interpreted to include an ordinary error range even if not expressly stated.

When the position relation between two parts is described using the terms such as "on", "above", "below", and "next", one or more parts may be positioned between two parts. When an element or layer is disposed "on" the other element or layer, another layer or another element may be interposed directly on the other element or therebetween.

Although the terms "first", "second", and the like are used for describing various components, these components are not confined by these terms. These terms are merely used for distinguishing one component from the other component. Therefore, a first component to be mentioned below may be a second component in a technical concept of the present disclosure. Expressions such as "first", "second", and "third" are terms used to distinguish components for every exemplary embodiment, but the exemplary embodiments are not limited by these terms. Accordingly, even the same term may denote a different component depending on the exemplary embodiment.

The area, length, height, size, or thickness of each component described in this specification is enlarged or reduced for convenience of description, and the scales of components illustrated in the drawings of this specification have different scales from the actual scales, for convenience of explanation so that it is not limited to the scale illustrated in the drawing.

The features of various embodiments of the present disclosure may be partially or entirely bonded to or combined with each other and may be interlocked and operated in technically various ways, and the embodiments may be carried out independently of or in association with each other.

Further, the terms to be described below are defined considering the functions in the exemplary embodiment of the present disclosure and may vary depending on the intention or usual practice of a user or operator. Accordingly, the term needs to be defined based on details throughout this specification.

A transistor which configures a pixel circuit of the present disclosure includes at least one of an oxide thin film transistor (oxide TFT), an amorphous silicon TFT (a-Si TFT), and a low temperature poly silicon (LTPS) TFT.

The following exemplary embodiments will be described with respect to an organic light emitting display apparatus. However, the exemplary embodiments of the present disclosure are not limited to the organic light emitting display apparatus, but may also be applied to an inorganic light emitting display apparatus including an inorganic light emitting material or a micro light emitting diode display apparatus. For example, the exemplary embodiments of the present disclosure may be applied to a quantum dot display apparatus.

Hereinafter, exemplary embodiments of the present disclosure will be described with reference to the drawings.

First Example Embodiment

Hereinafter, the First example embodiment of the present disclosure will be described in detail with reference to the accompanying drawings.

Figure 1B:
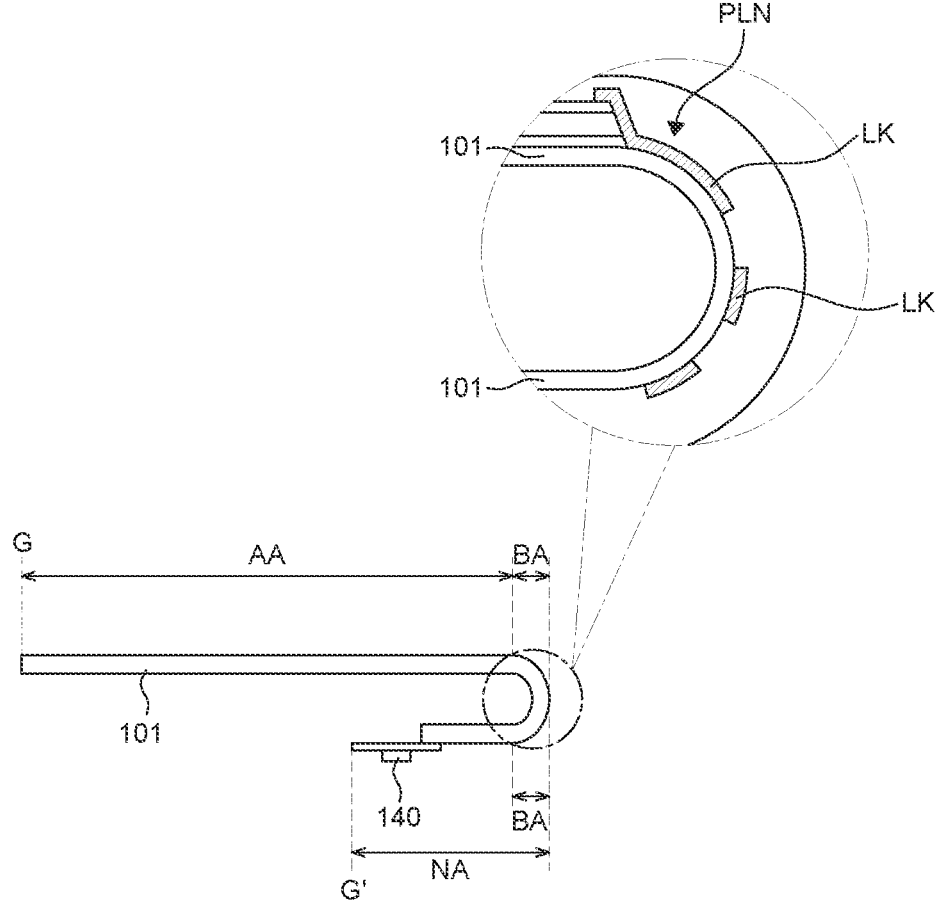
FIG. 1B is a cross-sectional view of a display apparatus taken along the line G-G' of FIG. 1A according to one embodiment of the present disclosure.

FIG. 1A is a view of a display apparatus according to one embodiment of the present disclosure. FIG. 1B is a cross-sectional view of a display apparatus taken along the line G-G' of FIG. 1A according to one embodiment of the present disclosure. FIG. 1A is a block diagram schematically illustrating components of the display apparatus 1000.

As illustrated in FIG. 1A, the display apparatus 1000 is configured to include a display panel PAN in which an image processor 110, a degradation compensating unit 150, a memory 160, a timing controller 120, a data driver 140, a power supply unit 180, and a gate driver 130 are formed.

The image processor 110 outputs a driving signal for driving various devices together with image data supplied from the outside. For example, a driving signal output from the image processor 110 may include a data enable signal, a vertical synchronization signal, a horizontal synchronization signal, and a clock signal.

The degradation compensating unit 150 (e.g., a circuit) calculates a degradation compensation gain value of a sub pixel SP of a display panel based on a sensing voltage Vsen supplied from the data driver 140, and calculates a dimming weight value based on the calculated degradation compensation gain value. Thereafter, the degradation compensating unit 150 modulates input image data Idata of each sub pixel SP of a current frame by the calculated degradation gain value and the dimming weight value, and then supplies the modulated image data Mdata to the timing controller 120.

The timing controller 120 is supplied with a driving signal together with the modulated image data from the degradation compensating unit 150. The timing controller 120 generates and outputs a gate timing control signal GDC for controlling an operation timing of the gate driver 130 and a data timing control signal DDC for controlling an operation timing of the data driver 140 based on the driving signal input from the image processor 110.

Further, the timing controller 120 controls the operation timings of the gate driver 130 and the data driver 140 to acquire at least one sensing voltage Vsen from each sub pixel SP to supply the sensing voltage to the degradation compensating unit 150.

The gate driver 130 outputs the scan signal to the display panel PAN in response to the gate timing control signal GDC supplied from the timing controller 120. The gate driver 130 outputs a scan signal through the plurality of gate lines GL1 to GLm. The gate driver 130 may be formed as an integrated circuit (IC), but is not limited thereto. For example, the gate driver 130 may be formed with a gate in panel (GIP) structure in which a thin film transistor is directly laminated on a substrate in the display apparatus 1000. The GIP may include a plurality of circuits, such as a shift register and a level shifter.

The data driver 140 outputs the data voltage to the display panel PAN in response to the data timing control signal DDC input from the timing controller 120. The data driver 140 samples and latches a digital type data signal DATA supplied from the timing controller 120 to convert the digital type data signal DATA into an analog type data voltage based on a gamma voltage.

The data driver 140 outputs a data voltage through a plurality of data lines DL1 to DLn.

Further, the data driver 140 supplies a sensing voltage Vsen input from the display panel PAN through the sensing voltage readout line to the degradation compensating unit 150.

The data driver 140 may be mounted on an upper surface of the display panel PAN in the form of an integrated circuit (IC), or may be directly formed on the display panel PAN, but is not limited thereto.

The power supply unit 180 outputs a high potential driving voltage EVDD and a low potential driving voltage EVSS to supply to the display panel PAN. The high potential driving voltage EVDD and the low potential driving voltage EVSS are supplied to the display panel PAN through a power line. For example, a voltage output from the power supply unit 180 is output to the data driver 140 or the gate driver 130 to be used to drive the data driver 140 or the gate driver 130.

The display panel PAN displays images in response to a data voltage and a scan signal supplied from the data driver 140 and the gate driver 130 which may be disposed in the non-active area NA, and a power supplied from the power supply unit 180.

The active area AA of the display panel PAN is configured by a plurality of sub pixels SP to display actual images. The sub pixels SP include a red (R) sub pixel, a green (G) sub pixel, and a blue (B) sub pixel, or include a white (W) sub pixel, a red sub pixel, a green sub pixel, and a blue sub pixel. For example, all the W, R, G, B sub pixels SP may be formed with the same area, or may be formed with different areas with each other.

In the memory 160, a look up table for a degradation compensation gain is stored, and a degradation compensating time of the organic light emitting diode of the sub pixel SP is stored. The degradation compensating time of the organic light emitting diode may be a driving count or a driving time of an organic light emitting display panel.

For example, the non-active area NA includes a bending area BA in which the display panel PAN may be bent or folded. The bending area BA corresponds to an area which is bent to place an area which does not perform a displaying function, such as the gate driver 130 and the data driver 140, to be bent on a rear surface of the active area AA. The bending area BA may be disposed between the active area AA and the data driver 140 as illustrated in FIG. 1A. In addition, the bending area BA may be located in at least one side of upper, lower, left, and right sides of the non-active area NA. Accordingly, an area occupied by the active area in the entire screen of the display apparatus is maximized and the non-active area NA may be hidden behind the active area AA so that a bezel may be reduced.

A signal link LK disposed in the bending area BA connects a signal pad and a signal line disposed in the active area AA. The signal link LK may be disposed to reduce a bending stress by expanding an area while extending to a direction intersecting the bending direction.

Figure 2:
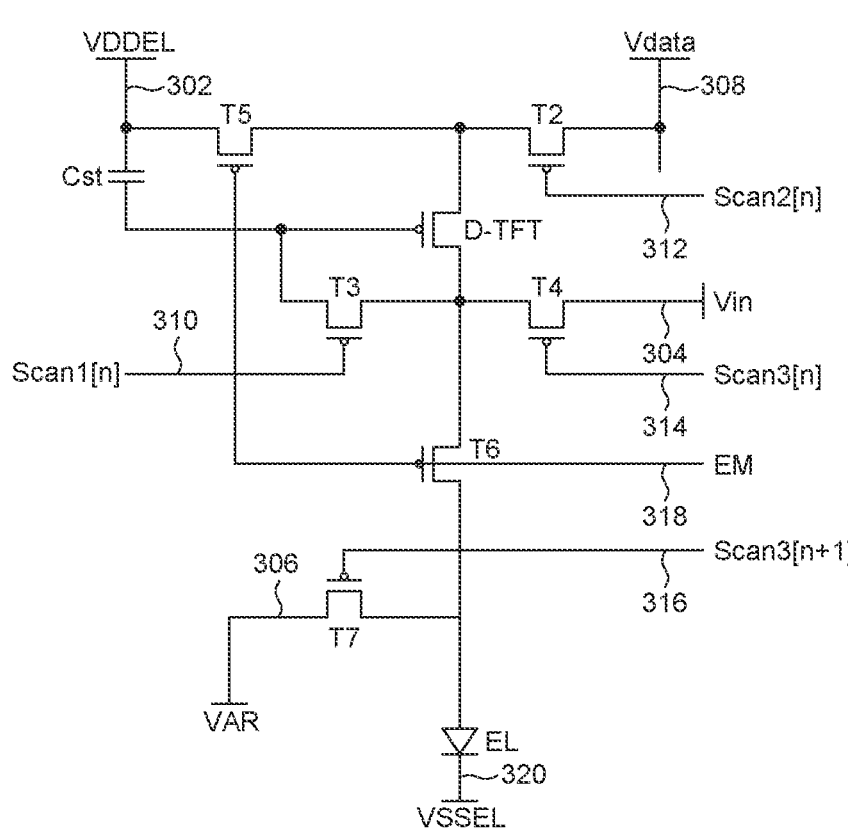
FIG. 2 is a circuit diagram illustrating a pixel driving circuit of a display apparatus according to an exemplary embodiment of the present disclosure.

FIG. 2 is a circuit diagram illustrating a pixel driving circuit of a display apparatus according to an exemplary embodiment of the present disclosure. The pixel driving circuit of the display apparatus 1000 according to the exemplary embodiment of the present disclosure, as illustrated in FIG. 2, may be configured by seven thin film transistors D-TFT and T2 to T7 and one storage capacitor Cst, but is not limited thereto.

One of the seven thin film transistors D-TFT and T2 to T7 illustrated in FIG. 2 is a driving thin film transistor D-TFT, and the others are switching thin film transistors T2 to T7 for internal compensation.

A second switching thin film transistor T2 is switched by a second scan signal Scan2[n] supplied to a second gate line 312 to supply a data voltage Vdata supplied through the data line 308 to a source electrode (or a first electrode) of the driving TFT D-TFT.

A third switching thin film transistor T3 is switched by a first scan signal Scan1[n] supplied to the first gate line 310 to connect a gate electrode and a drain electrode (or a second electrode) of the driving TFT D-TFT in a diode structure.

A fourth switching thin film transistor T4 is switched by a third scan signal Scan3[n] supplied to a third gate line 314 to supply an initialization voltage Vin supplied through an initialization voltage line 304 to the drain electrode (or the second electrode) of the driving TFT D-TFT.

A fifth switching thin film transistor T5 is switched by an emission control signal EM supplied to an emission control line 318 to supply a first power voltage VDDEL supplied through a first power line 302 to the source electrode (or the first electrode) of the driving TFT D-TFT.

A sixth switching thin film transistor T6 is switched by the emission control signal EM supplied to the emission control line 318 to electrically connect the drain electrode (or the second electrode) of the driving thin film transistor D-TFT and an anode electrode of the light emitting diode EL.

A seventh switching thin film transistor T7 is switched by a fourth scan signal Scan3[n+1] supplied to a fourth gate line 316 to supply a reset voltage VAR supplied through a reset voltage line 306 to the anode electrode of the light emitting diode EL. The fourth gate line 416 may be the same as the third gate line which supplies the third gate signal Scan3 [n+1] to an n+1-th (n is a positive integer) pixel row.

The storage capacitor Cst is connected between the power line 302 and the gate electrode of the driving thin film transistor D-TFT to charge a differential voltage between a high potential power voltage VDDEL and a data voltage Vdata+Vth obtained by compensating for a threshold voltage Vth of the driving thin film transistor D-TFT. By doing this, the storage capacitor may supply the charged voltage as a driving voltage of the driving thin film transistor D-TFT.

The driving thin film transistor D-TFT may control an emission intensity of the light emitting diode EL by controlling a current flowing through the light emitting diode EL through the sixth switching thin film transistor T6 according to a driving voltage charged in the storage capacitor Cst.

The light emitting diode EL includes an anode electrode, a cathode electrode, and an organic light emitting layer between the anode electrode and the cathode electrode. The anode electrode is connected to the drain electrode (or the second electrode) of the driving thin film transistor D-TFT through the sixth switching thin film transistor T6, and the cathode electrode is connected to a second power line 320 which supplies a second power voltage VSSEL.

As one example, according to the present disclosure, an example will be described in which the driving thin film transistor D-TFT uses an oxide semiconductor pattern as an active layer, and the switching thin film transistor T3 electrically connected to the driving thin film transistor D-TFT is used as oxide semiconductor. In addition, at least one of the remaining switching thin film transistors for internal compensation may use a polycrystalline semiconductor pattern as an active layer.

However, the present disclosure is not limited to an example proposed in FIG. 2, and is also applicable to an internal compensation circuit with various configurations.

Figure 3A:
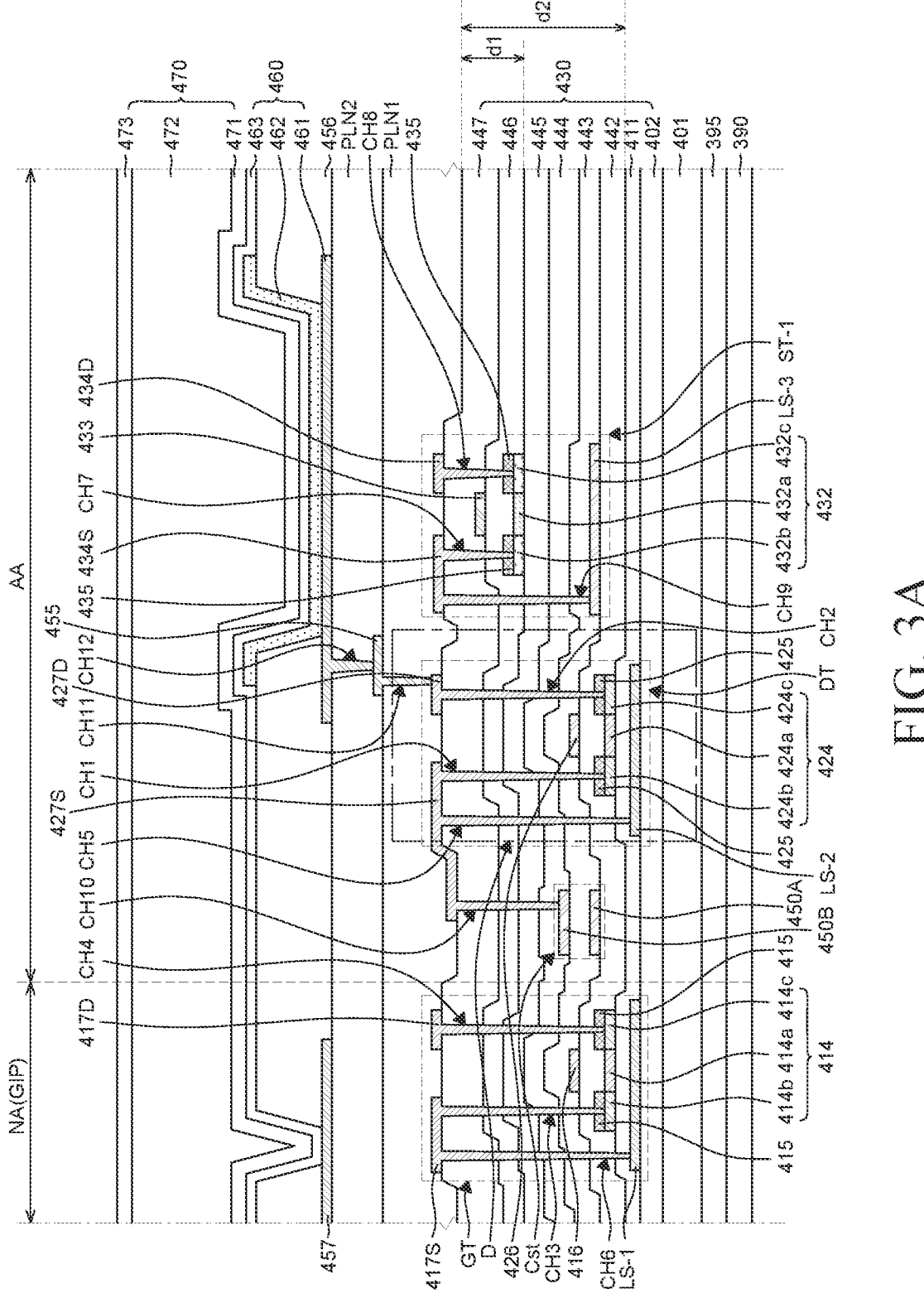
FIG. 3A is a cross-sectional view of a display apparatus according to an exemplary embodiment of the present disclosure.
Figure 3B:
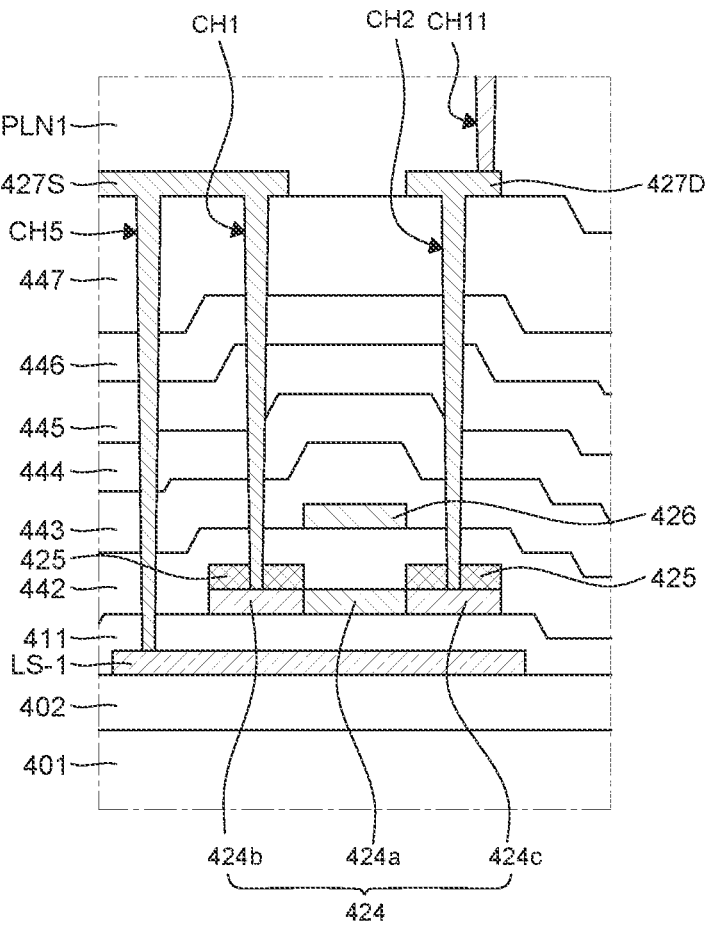
FIG. 3B is a cross-sectional view illustrating a part of a driving thin film transistor of FIG. 3A according to one embodiment of the present disclosure.
Figure 3C:
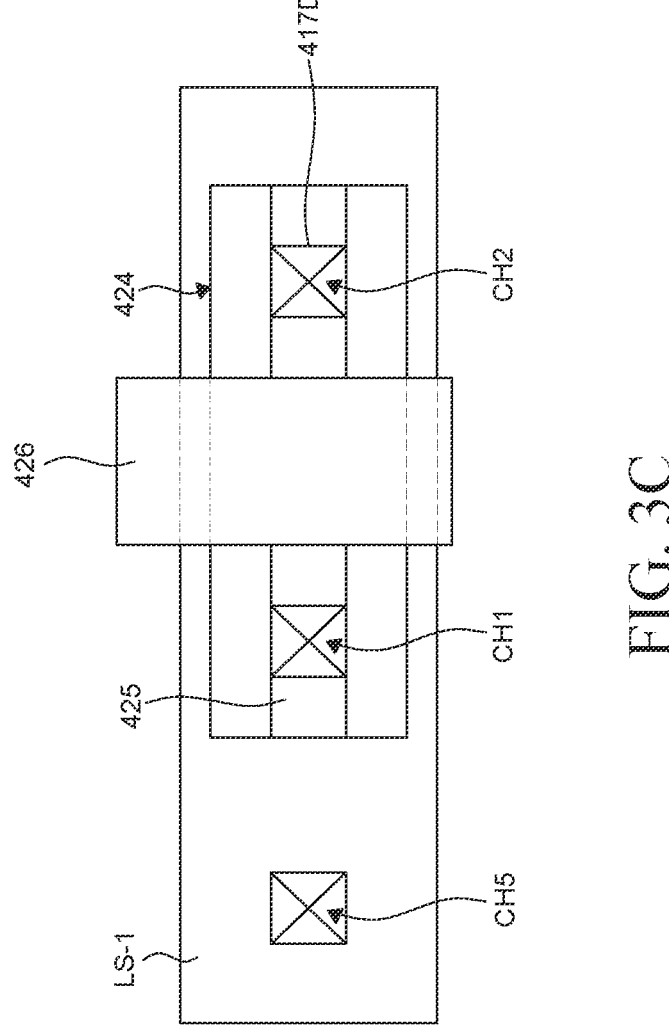
FIG. 3C is a plan view illustrating a part of a driving thin film transistor of FIG. 3B according to one embodiment of the present disclosure.

FIG. 3A is a cross-sectional view of a display apparatus according to an exemplary embodiment of the present disclosure. FIG. 3B is a cross-sectional view illustrating a part of a driving thin film transistor of FIG. 3A according to one embodiment of the present disclosure. FIG. 3C is a plan view illustrating a part of a driving thin film transistor of FIG. 3B according to one embodiment of the present disclosure. Specifically, FIG. 3A is a cross-sectional view illustrating a second thin film transistor DT and a third thin film transistor ST-1 which are disposed in the sub pixel SP of the active area AA and drive a light emitting diode 460, and a first thin film transistor GT disposed in a gate driving circuit unit GIP of the non-active area NA, and a storage capacitor Cst. In FIG. 3A, the second thin film transistor DT is a driving transistor including a polycrystalline semiconductor layer, and a third thin film transistor ST-1 is a switching transistor including an oxide semiconductor layer, but the present disclosure is not limited thereto. Further, FIG. 3B is an enlarged detailed view of one part of the second thin film transistor DT of FIG. 3A including a semiconductor layer, and FIG. 3C is a plan view of the part of the second thin film transistor DT shown in FIG. 3B.

As illustrated in FIG. 3A, in the sub pixel SP of the active area AA on the first substrate 390, the second thin film transistor DT, the third thin film transistor ST-1, and the storage capacitor Cst are disposed. Even though in FIG. 3A, only the second thin film transistor DT and the third thin film transistor ST-1 are illustrated, this is for the convenience of description so that a plurality of thin film transistors may be disposed on the actual first substrate 390.

Further, in the non-active area NA of the first substrate 390, a plurality of first thin film transistors GT which configure a gate driving circuit GIP may be disposed.

As illustrated in FIG. 3A, in the sub pixel SP of the active area AA of the substrate 390, the second thin film transistor DT having the same structure as the first thin film transistor GT may be disposed, but the present disclosure is not limited thereto.

Hereinafter, it is assumed that the first thin film transistor GT of the gate driving circuit GIP and the second thin film transistor DT which is a driving thin film transistor have the same structure, and a configuration of the second thin film transistor DT will be described.

The second thin film transistor DT and the third thin film transistor ST-1 have different types of impurities which are doped on the semiconductor layer to be differently configured as an N-type thin film transistor or a P-type thin film transistor.

The first substrate 390 and the second substrate 401 may be configured by a multi-layer in which an organic film and an inorganic film are alternately laminated. For example, the first substrate 390 and the second substrate 401 may be formed by alternately laminating an organic layer such as polyimide and an inorganic film such as silicon oxide ($SiO_2$), but are not limited thereto.

The second substrate 401 may disposed above the first substrate 390 with an inter-layer 395 therebetween, and the inter-layer 395 and the second substrate 401 may, or may not be disposed depending on the situation. The exemplary embodiment of the present disclosure is not limited thereto.

The inter-layer 395 may be formed of an inorganic film. For example, the inter-layer 395 may be formed by a single layer of silicon nitride (SiNx) or silicon oxide (SiOx) or a multilayer thereof, but the exemplary embodiment of the present disclosure is not limited thereto.

A first lower buffer layer 402 is formed on the first substrate 390. The first lower buffer layer 402 is provided to block moisture which may penetrate from the outside, and may be used by laminating a silicon oxide ($SiO_2$) film into a plurality of layers.

Referring to FIGS. 3A to 3C, the second thin film transistor DT includes a second semiconductor layer 424, a second gate electrode 426, a first source electrode 427S and a first drain electrode 427D. The second semiconductor layer 424 is disposed on a lower buffer layer 402 on the first substrate 390, and the second gate electrode 426 is disposed on the second gate insulating layer 442 and overlaps the second semiconductor layer 424. The first source electrode 427S and the first drain electrode 427D are disposed on a plurality of insulating layers on the second gate electrode 426. The second semiconductor layer 424 is configured by a polycrystalline semiconductor, but the exemplary embodiment of the present disclosure is not limited thereto.

Below the second thin film transistor DT, a second shield layer LS-2 which protects the second semiconductor pattern 424 from light incident from the outside may be formed on the first lower buffer layer 402 below the second semiconductor pattern 424. However, the second shield layer LS-2 may be omitted depending on the design.

The second shield layer LS-2 may be formed of a metal pattern on the lower buffer layer 402. However, the second shield layer LS-2 is not limited to a thin metal film.

The second shield layer LS-2 is formed to have an area larger than the second semiconductor pattern 424 so as to completely block the external light which is incident onto the second semiconductor pattern 424 while being formed below the second polycrystalline semiconductor pattern 424 according to one embodiment. Accordingly, the second shield layer LS-2 may completely overlap the second semiconductor pattern 424.

The second lower buffer layer 411 may be formed on the second shield layer LS-2. The second lower buffer layer 411 may be configured by the same material as the first lower buffer layer 402, but is not limited thereto.

The second semiconductor pattern 424 is disposed on the second lower buffer layer 411. The second semiconductor pattern 424 may be, for example, configured by a polycrystalline semiconductor. The second semiconductor pattern 424 includes a second channel region 424a in which charges move, a second source region 424b and a second drain region 424c which are adjacent to the second channel region 424a with the second channel region 424a therebetween. The second source region 424b and the second drain region 424c may be conductive regions obtained by doping impurity ions such as phosphate or boron in an intrinsic polycrystalline semiconductor pattern, but are not limited thereto.

Referring to FIGS. 3B and 3C, a second etch stopper 425 is formed on the second semiconductor pattern 424 of the first thin film transistor DT. For example, the second etch stopper 425 may be formed on the second source region 424b and the second drain region 424c. The second etch stopper 425 may be formed while being in contact with the second semiconductor layer 424 on upper surfaces of the second source region 424b and the second drain region 424c.

The second etch stopper 425 may be configured by a metal material which is hardly etched when an inorganic insulating layer which configures the first lower buffer layer 402, the second lower buffer layer 411, and the interlayer insulating layers are etched. For example, the second etch stopper 425 may be a titanium compound which rarely etched during the dry-etching of the inorganic insulating layer, such a titanium nitride (TiN), titanium carbon (TiC), aluminum nitride (AlN), and titanium aluminum nitride (TiAlN), but the exemplary embodiment of the present disclosure is not limited thereto.

Among various constituent materials of the second etch stopper 425, titanium nitride (TiN) is a material having a thermal stability and a robust film quality. Similar to titanium (Ti), titanium nitride (TiN) may be advantageous to block hydrogen and adjust a threshold voltage electrical characteristic by adjusting an energy difference (work function) between the gate electrode and the active layer according to selection of a composition ratio of titanium (Ti) and nitrogen (N) from titanium nitride (TiN).

Further, referring to FIGS. 3A, 3B, and 3C, the second etch stopper 425 is formed on upper surfaces of the second source region 424b and the second drain region 424c, and a first contact hole CH1 and a second contact hole CH2 which expose a part of the second source region 424b and the second drain region 424c are disposed in the second etch stopper 245.

Widths of the first contact hole CH1 and the second contact hole CH2 may be smaller than widths of the second source region 424b and the second drain region 424c. The second source electrode 427S and the second drain electrode 427D are directly in contact with the second source region 424b and the second drain region 424c, respectively, through the first contact hole CH1 and the second contact hole CH2. As it will be described below, the second source electrode 427S is electrically connected to the second shield layer LS-2 through a fifth contact hole CH5.

The second etch stopper 425 may be a metal material which may be more tolerant to the dry etch than the inorganic insulating layers. In this case, the ohmic contact is not performed between the second etch stopper 425, and the second source region 424b and the second drain region 424c which are polycrystalline semiconductor patterns so that a surface resistance may be large. In this case, it is difficult to ensure the reliability of the second thin film transistor DT, so that contact areas between the second source electrode 427S and the second source region 424b, and between the second drain electrode 427D and the second drain region 424c are reduced to reduce a sheet resistance.

The second semiconductor layer 424 on which the second etch stopper 425 is formed is insulated by the first gate insulating layer 442.

The first gate insulating layer 442 is formed by depositing the inorganic insulating layer, such as silicon oxide (SiO$_2$) on the entire surface of the first substrate 390 on which the second semiconductor layer 424 is formed. The first gate insulating layer 442 protects and insulates the second semiconductor layer 424 from the outside.

A second gate electrode 426 which overlaps the second channel region 424a of the second semiconductor layer 424 may be formed on the first gate insulating layer 442.

The second gate electrode 426 may be configured by a metal material. For example, the second gate electrode 426 may be formed of a single layer or multiple layers formed of any one of molybdenum (Mo), aluminum (Al), chrome (Cr), gold (Au), titanium (Ti), nickel (Ni), neodymium (Nd), and copper (Cu), or an alloy thereof, but is not limited thereto.

A plurality of insulating layers may be formed between the second gate electrode 426 and the second source electrode 427S and the second drain electrode 427D.

Referring to FIG. 3A, the plurality of insulating layers may include a first interlayer insulating layer 443 which is in contact with an upper surface of the first gate electrode 426, a second interlayer insulating layer 444, an upper buffer layer 445, a second gate insulating layer 446, and a third interlayer insulating layer 447 which are sequentially laminated thereon.

The second source electrode 427S and the second drain electrode 427D are disposed on the third interlayer insulating layer 447. The second source electrode 427S and the second drain electrode 427D are directly connected to the second source region 424b and the second drain region 424c, respectively, through the first contact hole CH1 and the second contact hole CH2. The first contact hole CH1 and the second contact hole CH2 pass through the first gate insulating layer 442, the first interlayer insulating layer 443, the second interlayer insulating layer 444, the upper buffer layer 445, the second gate insulating layer 446, and the third interlayer insulating layer 447.

As a result, the second source electrode 427S and the second drain electrode 427D are in direct contact with the second source region 424b and the second drain region 424c, respectively. Accordingly, the second source electrode 427S and the second drain electrode 427D may be in contact with the second source region 426b and the second drain region 424c, respectively, in a narrower area than those contacts with the second source region 424b and the second drain region 424c, respectively, via the second etch stopper 425 so that the electric resistance may be reduced.

The second source electrode 427S is electrically connected to the second shield layer LS-2 through the fifth contact hole CH5. The second shield layer LS-2 may be referred to as a bottom shield metal (BSM) layer.

Since the second shield layer LS-2 is a metal material, the second shield layer may form a capacitance with the second channel region 424a. If the second shield layer LS-2 is electrically floated, the capacitance change occurs and a shifted amount of the threshold voltage Vth of the second thin film transistor DT may be changed. Accordingly, unintended visual defect (for example, luminance change) may occur.

Further, if the second source electrode 427S is not electrically connected to the second shield layer LS-2 through the fifth contact hole CH5, charges are accumulated in the second channel region 424a so that a drain current may rapidly increase. However, if the second shield layer LS-2 is electrically connected to the second source electrode 427S, accumulated charges are reduced and the rapid increase of the drain current may be suppressed.

Accordingly, the second shield layer LS-2 is electrically connected to any one of the second source electrode 427S and the second drain electrode 427D to maintain a constant capacitance. In FIG. 3A, the second shield layer LS-2 to which the second source electrode 427S of the second thin film transistor DT is electrically connected through the fifth contact hole CH5 is illustrated. Accordingly, the same voltage as the second source electrode 427S of the second thin film transistor DT is applied to the second shield layer LS-2.

The first thin film transistor GT of the non-active area NA has the same structure as the second thin film transistor DT of the active area AA. However, different symbols are used to be distinguished from components of the first thin film transistor GT.

For example, the first thin film transistor GT includes a first semiconductor layer 414, a first gate electrode 416, a first source electrode 417S and a first drain electrode 417D. The first semiconductor layer 414 is located on the same layer as the second semiconductor layer 424 with the same material, and the first gate electrode 416 is located on the same layer as the second gate electrode 426 with the same material. The first source electrode 417S and the first drain electrode 417D are located on the same layer as the second source electrode 427S and the second drain electrode 427D with the same material.

The first source electrode 417S and the first drain electrode 417D are directly connected to the first source region 414b and the first drain region 414c of the first semiconductor layer 414 through the third contact hole CH3 and the fourth contact hole CH4, respectively. The first channel region 414a may be disposed between the first source region 414b and the first drain region 414c of the first semiconductor layer 414.

Accordingly, the first to fourth contact holes CH1 to CH4 may have the same depth.

A first shield layer LS-1 which protects the first semiconductor pattern 414 from light incident from the outside may be formed below the first semiconductor pattern 414. The first shield layer LS-1 may be disposed on the same layer with the same material as the second shield layer LS-2, and may perform the same function.

A first etch stopper 415 is further formed at an upper edge of the first semiconductor pattern 414 of the first thin film transistor GT. For example, the first etch stopper 415 may be formed on upper edges of the first source region 414b and the first drain region 414c. The first etch stopper 415 may be formed on upper surfaces of the first source region 414b and the first drain region 414c to be in contact with the first semiconductor layer 414. The effect according to the first etch stopper 415 is the same as the effect of the second etch stopper 425 which has been described so that a redundant description will be omitted.

The first source electrode 417S is electrically connected to the first shield layer LS-1 through a sixth contact hole CH6. The effect by the electric connection of the first shield layer LS-1 and the first source electrode 417S is the same as the effect of connecting the second source electrode 427S to the second shield layer LS-2 through the fifth contact hole CH5, as was described above, so that a redundant description will be omitted.

Further, in FIG. 3A, the sub pixel SP includes a third thin film transistor ST-1 including an oxide semiconductor pattern, but is not limited thereto. Even though in FIG. 3A, one switching thin film transistor is illustrated, a plurality of switching thin film transistors may be disposed in the sub pixel SP. For example, the pixel circuit in the sub pixel SP may be configured with various configurations such as 3T1C, 4T1C, 5T1C, 6T1C, and 7T1C, so that one or more switching thin film transistors may be disposed. Here, "3T" denotes three thin film transistors disposed in one pixel circuit, and "1C" denotes one capacitor disposed in one pixel circuit.

The third thin film transistor ST-1 includes a third semiconductor layer 432, a third gate electrode 433, a third source electrode 434S, and a third drain electrode 434D.

In FIG. 3A, the third semiconductor layer 432 is an oxide semiconductor layer, but is not limited thereto. The third semiconductor layer 432 includes a third channel region 432a, and a third source region 432b and a third drain region 432c which are adjacent to the third channel region 432a with the third channel region 432a therebetween.

A third etch stopper 435 is further formed at an upper edge of the third semiconductor pattern 432 of the third thin film transistor ST-1. For example, the third etch stopper 435 may be formed on upper edges of the third source region 432b and the third drain region 432c. The third etch stopper 435 may be formed while being in contact with the third semiconductor layer 432 on upper surfaces of the third source region 432b and the third drain region 432c. The effect according to the third etch stopper 433 is the same as the effect of the second etch stopper 425 which has been described above so that a redundant description will be omitted.

The third gate electrode 433 is disposed on the third semiconductor layer 432 with the third gate insulating layer 447 therebetween.

The third source electrode 434S and the third drain electrode 434D are located on the third gate electrode 433 with the third interlayer insulating layer 447 therebetween.

The third source electrode 434S and the third drain electrode 434D are connected to the third source region 432b and the third drain region 432c, respectively, through a seventh contact hole CH7 and an eighth hole CH8 which pass through the second gate insulating layer 446 and the third interlayer insulating layer 447.

Further, the third shield layer LS-3 may be disposed below the third semiconductor layer 432.

The third shield layer LS-3 is disposed below the third semiconductor layer 432 while overlapping the third semiconductor layer 432 to protect the third semiconductor layer 432 from light incident from the outside.

Even though in FIG. 3A, it is illustrated that the third shield layer LS-3 is formed on the first gate insulating layer 442, it is not limited thereto, and the third shield layer LS-3 may also be formed on the first interlayer insulating layer 443.

The third source electrode 434S is electrically connected to the third shield layer LS-3 through a ninth contact hole CH9. The effect by the electric connection of the third source electrode 434S and the third shield layer LS-3 is the same as the effect of connecting the second source electrode 427S to the second shield layer LS-2 through the fifth contact hole CH5, as described above, so that a redundant description will be omitted.

Referring to FIG. 3A, the sub pixel SP further includes a storage capacitor Cst.

The storage capacitor Cst stores a data voltage which is applied through the data line for a predetermined period and then supplies the data voltage to the light emitting diode 460.

The storage capacitor Cst includes two corresponding electrodes and a dielectric material disposed therebetween. The storage capacitor Cst includes a first electrode 450A of the storage capacitor Cst disposed on the same layer with the same material as the second gate electrode 426, and a second electrode 450B corresponding to the first electrode 450A of the storage capacitor Cst.

The first interlayer insulating layer 443 may be disposed between the first electrode 450A and the second electrode 450B of the storage capacitor Cst.

The second electrode 450B of the storage capacitor Cst may be electrically connected to the first source electrode 427S through the tenth contact hole CH10.

If the first etch stopper 415, the second etch stopper 425, and the third etch stopper 435 are not disposed in each semiconductor pattern, two processes including a first step of forming the seventh contact hole CH7 and the eighth contact hole CH8 corresponding to a depth d1, and a second step of forming the first contact hole CH1 to fourth contact hole CH4 corresponding to a depth d2 may be needed.

Generally, the display apparatus includes a plurality of metal patterns and a plurality of contact holes. Accordingly, in order to reduce a manufacturing process time and a process cost of the display apparatus, and efficiently perform the manufacturing process, it is required to reduce a mask process which is performed during the manufacturing process.

Referring to FIG. 3A, the first shield layer LS-1 and the second shield layer LS-2 may be formed by one mask process using the same mask.

Further, the first gate electrode 416, the second gate electrode 426, the first electrode 450A of the storage capacitor Cst, and the third shield layer LS-3 may be formed on the same layer with the same material. For example, the second gate electrode 426, the first gate electrode 416, the first electrode 450A of the storage capacitor Cst, and the third shield layer LS-3 may be formed by one mask process.

Further, the second source electrode 427S, the second drain electrode 427D, the third source electrode 434S, the third drain electrode 434D, the first source electrode 417S, and the first drain electrode 417D may be formed by one mask process.

Here, one mask process includes a photolithography process including a series of deposition, exposure, etching, and cleaning processes.

In order to form the second source electrode 427S, the second drain electrode 427D, the third source electrode 434S, the third drain electrode 434D, the first source electrode 417S, and the first drain electrode 417D by one mask process and connect each of the electrode to corresponding source region and drain region of the semiconductor pattern, it is necessary to form the first to ninth contact holes CH1 to CH9 by one mask process. Accordingly, when the first etch stopper 415, the second etch stopper 425, and the third etch stopper 435 are not disposed in each semiconductor pattern, the first semiconductor layer 414 and the second semiconductor layer 424 are located below the third semiconductor layer 432. Accordingly, when the first to ninth contact holes CH1 to CH9 are simultaneously formed, the third semiconductor layer 432 may be exposed to the etch gas for a longer time than the first semiconductor layer 414 and the second semiconductor layer 424 so that the third semiconductor layer 432 may be damaged. Accordingly, the difference in the degree of etching the first semiconductor layer 414, the second semiconductor layer 424, and the third semiconductor layer 432 may be suppressed by disposing the second etch stopper 425 on the second semiconductor layer 424, the third etch stopper 435 on the third semiconductor layer 432, and the first etch stopper 415 on the first semiconductor layer 414. Accordingly, the second source electrode 427S, the second drain electrode 427D, the third source electrode 434S, the third drain electrode 434D, the first source electrode 417S, and the first drain electrode 417D are simultaneously connected to the corresponding source region and drain region, respectively, of the semiconductor pattern by one process.

Figure 3D:
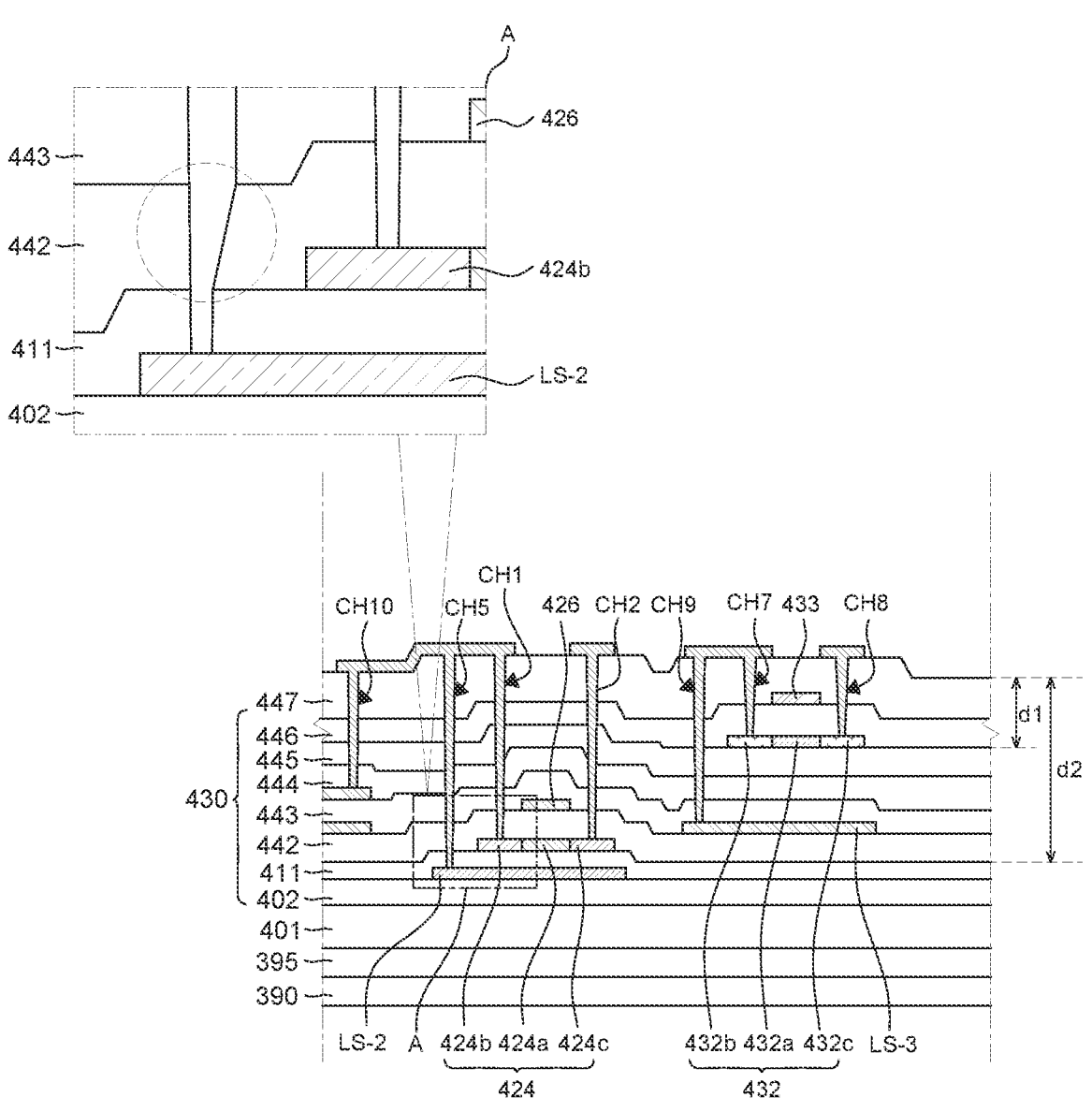
FIG. 3D is an enlarged cross-sectional view of a part of a thin film transistor of a comparative example.
Figure 3E:
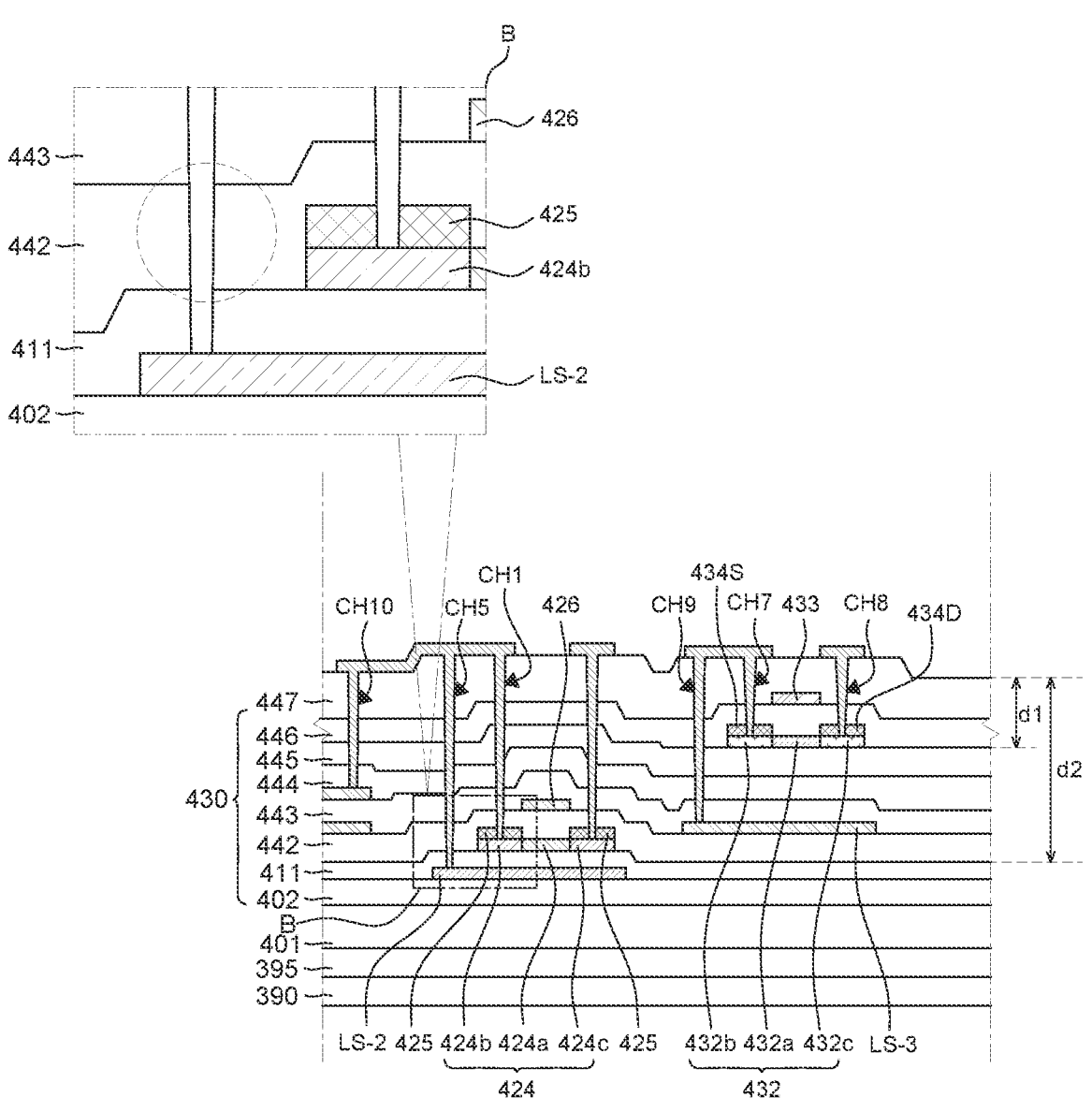
FIG. 3E is an enlarged cross-sectional view of a part of a thin film transistor according to an exemplary embodiment of the present disclosure.

FIGS. 3D and 3E are views illustrating another effect of an exemplary embodiment of the present disclosure.

Referring to FIG. 3D, if the first etch stopper 415, the second etch stopper 425, and the third etch stopper 435 are not disposed in each semiconductor pattern, two processes including a first step of forming the seventh contact hole CH7 and the eighth contact hole CH8 corresponding to a depth d1, and a second step of forming the first to fourth contact holes CH1 to CH4 corresponding to a depth d2 may be needed. Accordingly, as illustrated in the area A of FIG. 3D, a shape of the fifth contact hole CH5 through which the second shield layer LS-2 and the second source electrode 427S are in contact may be uneven across the depth of the fifth contact hole CH5. Accordingly, electrical connection of the second shield layer LS-2 and the second source electrode 427 may not be precisely performed. When the defective contact of the second shield layer LS-2 and the second source electrode 427 occurs, the voltage may not be applied.

Referring to FIGS. 3D and 3E, since the first etch stopper 415, the second etch stopper 425, and the third etch stopper 435 are disposed in each semiconductor pattern, when the first to the ninth contact holes CH1 to CH9 are formed, the contact holes may be formed by one process. Accordingly, as illustrated in the area B of FIG. 3E, a shape of the fifth contact hole CH5 through which the second shield layer LS-2 and the second source electrode 427S are in contact with each other may be uniform.

Referring to FIG. 3A, a first planarization layer PLN1 is formed on the first substrate 390 on which the second thin film transistor DT and the third thin film transistor ST-1 are disposed. The first planarization layer PNL1 may be formed of an organic material such as photo acryl, and may be configured by a plurality of layers formed of inorganic layers and organic layers, but the exemplary embodiment of the present disclosure is not limited thereto.

A first connection electrode 455 is formed on the first planarization layer PLN1. The first connection electrode 455 electrically connects an anode electrode 461 which is one component of the light emitting diode 460 and the first thin film transistor DT through an eleventh contact hole CH11 formed in the first planarization layer PLN1.

A second planarization layer PLN2 may be formed on the first connection electrode 455. The second planarization layer PLN2 may be configured by an organic material such as photo acryl, as the first planarization layer PNL1, but may also be configured by a plurality of layers formed of inorganic layers and organic layers.

The anode electrode 461 is formed on the second planarization layer PNL2. The anode electrode 461 is electrically connected to the first connection electrode 455 through a twelfth contact hole CH12 formed in the second planarization layer PLN2.

The anode electrode 461 is formed of a single layer or a plurality of layers, formed of a material such as calcium (Ca), barium (Ba), magnesium (Mg), aluminum (Al), and silver (Ag), or an alloy thereof. The anode electrode 461 connects to the second drain electrode 427D of the second thin film transistor DT to apply an image signal from the outside.

In addition to the anode electrode 461, in the non-active area NA, a second connection electrode 457 which electrically connects a common voltage line VSS and the cathode electrode 463 may be further provided.

A bank layer 456 is formed on the second planarization layer PNL2. The bank layer 456 is a partition to divide the sub pixels SP to suppress light of specific color output from adjacent sub pixels SP from being mixed and output.

A light emitting layer 462 is formed on a partial area of the upper surface of the anode electrode 461 and the inclined surface of the bank layer 456. For example, the light emitting layer 462 may be an organic light emitting layer, but the exemplary embodiments of the present disclosure are not limited thereto. The light emitting layer 462 is formed in each sub pixel, and may be an R-organic light emitting layer which emits red light, a G-organic light emitting layer which emits green light, and a B organic light emitting layer which emits blue light. Further, the light emitting layer 462 may be a W-organic light emitting layer which emits white light.

The light emitting layer 462 may include an emission layer, an electron injection layer and a hole injection layer which inject electrons and holes to the emission layer, respectively, and electron transport layer and hole transport layer which transmit the injected electrons and holes to the organic layer, respectively. However, the exemplary embodiments of the present disclosure are not limited thereto.

A cathode electrode 463 is formed on the light emitting layer 462. The cathode electrode 463 may be formed of a transparent conductive material such as indium tin oxide (ITO) or indium zinc oxide (IZO) or metal with a thin thickness to which visible ray transmits, but is not limited thereto.

An encapsulation layer 470 is formed on the cathode electrode 463. In FIG. 3A, as an example embodiment of the encapsulation layer 470, it was shown that the encapsulation layer 470 is configured by a plurality of layers including an inorganic layer 471, an organic layer 472, and an inorganic layer 473. However, it is not limited thereto so that the encapsulation layer 470 may be configured by a signal layer configured by an inorganic layer, configured by a double layer of an inorganic layer/organic layer, and also configured by triple or more layer of inorganic layers and organic layers. The inorganic layers 471 and 473 may be configured by an inorganic material, such as silicon nitride (SiNx) and silicon oxide (SiOx), but are not limited thereto. Further, the organic layer 472 may be formed of an organic material such as polyethylene terephthalate, polyethylene naphthalate, polycarbonate, polyimide, polyethylene sulfonate, polyoxymethylene, and polyarylate, or a mixture thereof, but is not limited thereto.

A cover glass is disposed on the encapsulation layer 470 to be attached by an adhesive layer. As the adhesive layer, any material with good adhesiveness, heat resistance, and water resistance may be used, but in the present disclosure, a thermosetting resin, such as an epoxy-based compound, an acrylate-based compound or an acrylic rubber, may be used. Further, as the adhesive, a photocurable resin may be used, and in this case, light such as ultraviolet ray is irradiated onto the adhesive layer to cure the adhesive layer.

The adhesive layer bonds the substrate 401 and the cover glass, and may serve as an encapsulation agent to suppress the moisture from permeating into the display apparatus 1000.

The cover glass is an encapsulation cap for encapsulating the display apparatus 1000, and may use a protective film such as a polystyrene (PS) film, a polyethylene (PE) film, a polyethylene naphthalate (PEN) film, or a polyimide (PI) film, or also use a glass, but the present disclosure is not limited thereto.

Figure 3F:
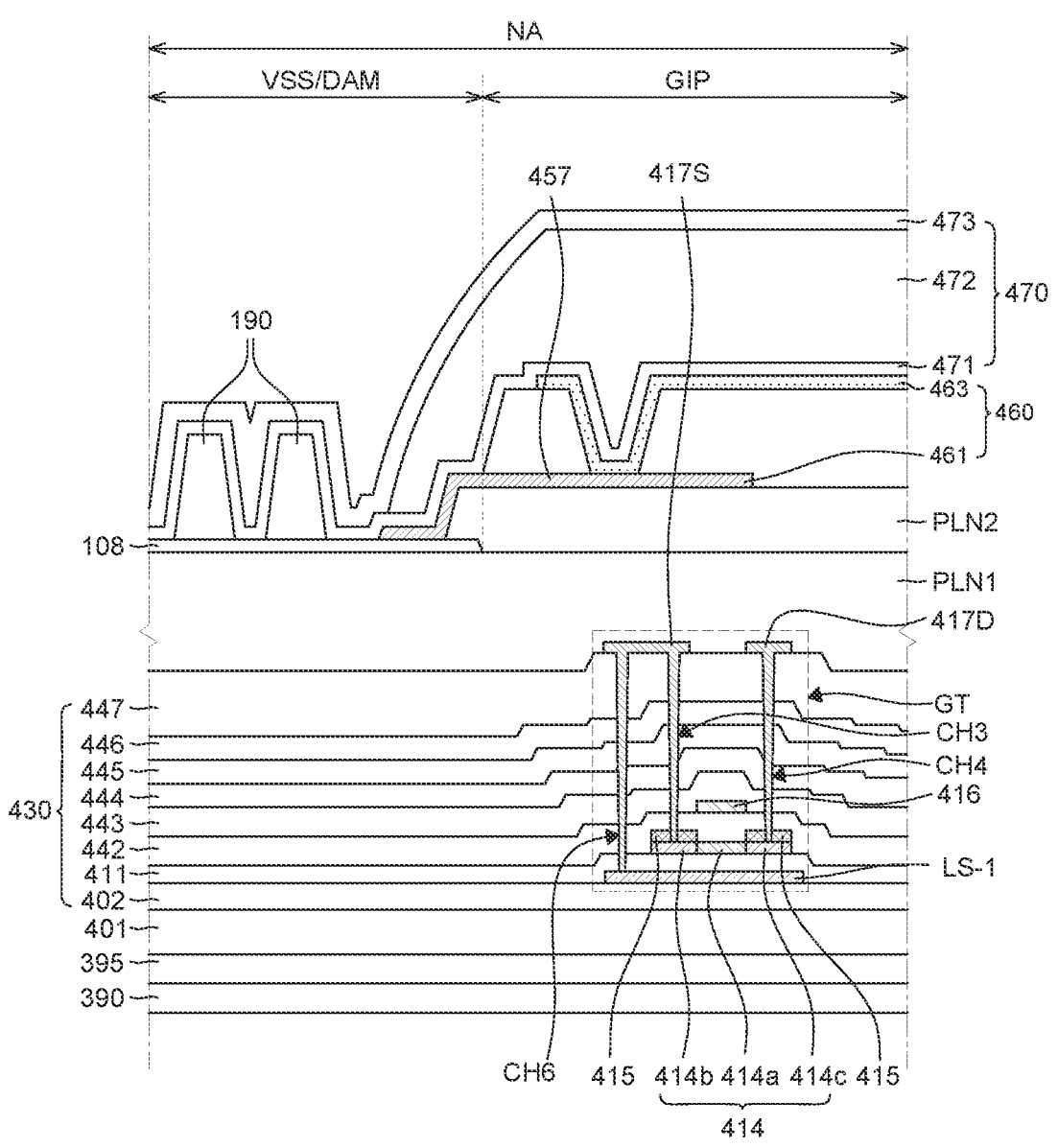
FIG. 3F is a cross-sectional view illustrating a part of a non-active area of a display apparatus according to an exemplary embodiment of the present disclosure.

The non-active area NA may be disposed at an outer periphery of the active area AA, as illustrated in FIG. 3F, and a driving circuit unit (for example, GIP), or a power line may be disposed thereon. Further, in the non-display area NA, materials used for the configuration of the active area AA may be disposed for a different purpose. For example, the same metal 108 as the source/drain electrode of the TFT of the active area may be disposed in a VSS/DAM region of the non-active area NA for a power line or an electrode. The same metal as one electrode (for example, anode electrode) of the light emitting diode 460 is applied as a second connection electrode 457 to be disposed in the non-active area NA for a wiring line or an electrode.

The encapsulation layer 470 covers an upper portion of the light emitting diode 460 of the active area AA. The organic films 471 and 473 of the encapsulation layer 470 may block the penetration of moisture or oxygen, and the organic film 472 may planarize a surface of the inorganic layer 471.

The organic film 472 has a predetermined level of flowability to flow to the outside of the non-active area NA during the application. Therefore, a block structure 190 is disposed to control the spreading of the organic film 472 into the non-active area NA. Even though in FIG. 3F, it is illustrated that two blocking structures 190 are disposed, two or more blocking structures 190 may also be disposed. Further, the blocking structure 190 may be disposed so as to enclose the active area AA or disposed in the active area AA. The blocking structure 190 may be formed as a plurality of layers using at least one material. For example, the blocking structure 190 may be formed by a material used to form the first planarization layer PLN1, the second planarization layer PLN2, and the bank 456.

Various electrodes and electrodes/wiring lines disposed in the non-active area NA may be formed of a gate metal and/or source/drain metal 108. The gate metal is formed of the same material as the gate electrode of the TFT by the same process, and the source/drain metal may be formed of the same material as the source/drain electrode of the TFT by the same process, but the exemplary embodiments of the present disclosure are not limited thereto.

For example, the source/drain metal may be used as a power source (for example, a low potential power source VSS or a high potential power source VDD) wiring line 108. The wiring line 108 is connected to the second connection electrode 457, and the cathode electrode 463 of the light emitting diode 460 may be supplied with the power through connection with the wiring line 108 and the second connection electrode 457. The second connection electrode 457 is in contact with the wiring line 108, and extends along outermost sidewalls of the first planarization layer PLN1 and the second planarization layer PLN2 to be in contact with the cathode electrode 463 above the first planarization layer PLN1 and the second planarization layer PLN2. The second connection electrode 457 may be a conductive layer which is formed of the same material as the anode electrode 461 of the light emitting diode 460 by the same process. The contact of at least one of the first shield layer LS-1, the second shield layer LS-2, and the third shield layer LS-3 with the power source wiring line 108 may be configured by a mesh structure.

Second Example Embodiment

Figure 4:
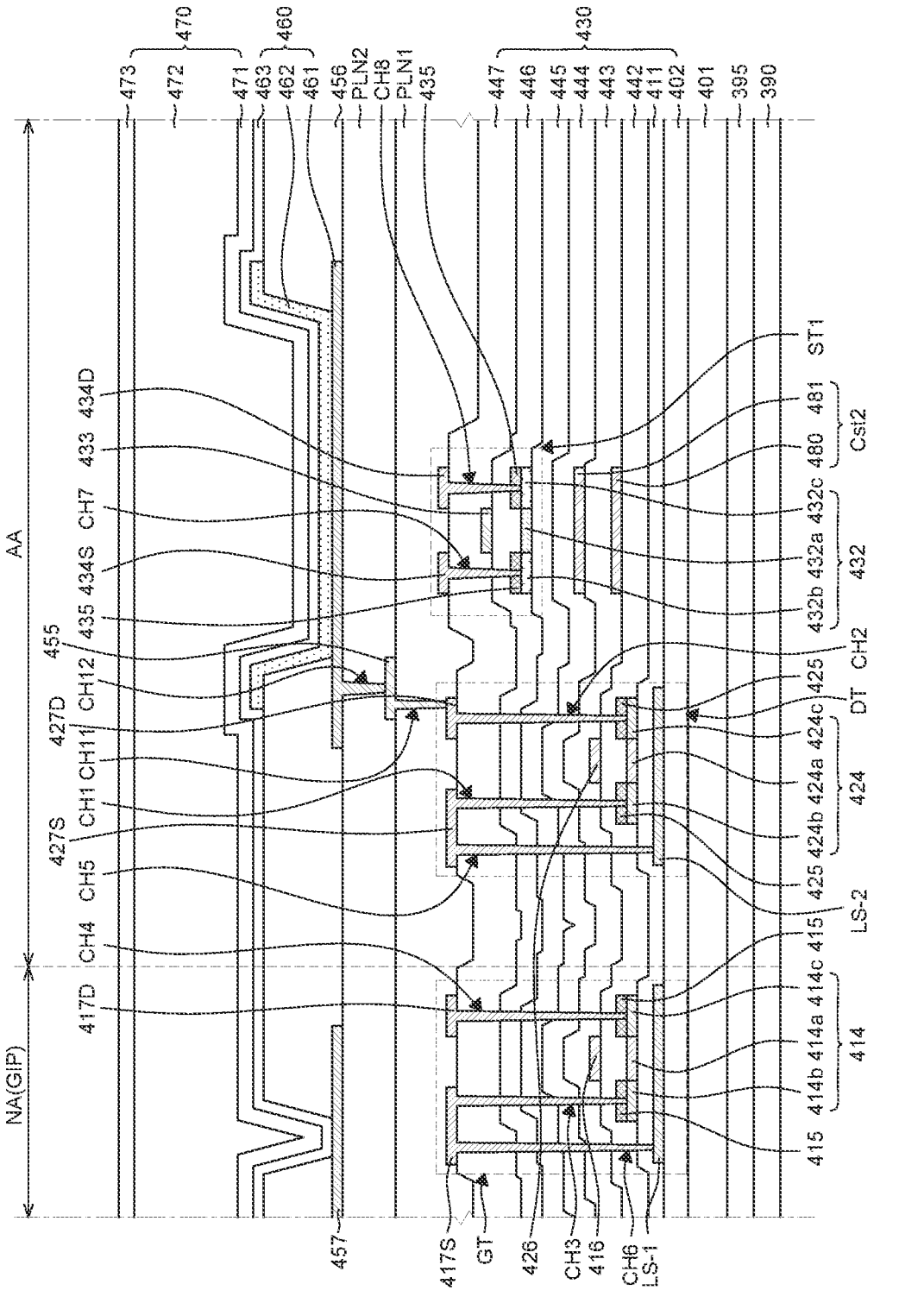
FIG. 4 is a cross-sectional view of a display apparatus according to another exemplary embodiment of the present disclosure.

FIG. 4 is a cross-sectional view of a display apparatus according to another exemplary embodiment of the present disclosure. As compared with FIG. 3A, the remaining structure of FIG. 4 except the third shield layer of FIG. 3A may be the same. Accordingly, the description of the same configuration and effect as those of FIG. 3A will be omitted.

In FIG. 4, the sub pixel further includes a second storage capacitor Cst2.

The second storage capacitor Cst2 stores a data voltage which is applied through the data line for a predetermined period and then supplies the data voltage to the light emitting diode 460.

The second storage capacitor Cst2 includes two electrodes, overlapping each other, and a dielectric material disposed therebetween. The second storage capacitor Cst2 includes a third electrode 480 disposed on the same layer with the same material as the first gate electrode 416, and a fourth electrode 481 corresponding to the third electrode 480.

A first interlayer insulating layer 443 may be interposed between the third electrode 480 and the fourth electrode 481 of the second storage capacitor Cst2.

When a second storage capacitor Cst2 which serves as a capacitor and a third shield layer LS-3 is configured below the third thin film transistor ST-1, there is no need to apply a ninth contact hole CH9 to FIG. 4 so that the integration is improved and thus the resolution may be also improved.

Third Example Embodiment

Figure 5:
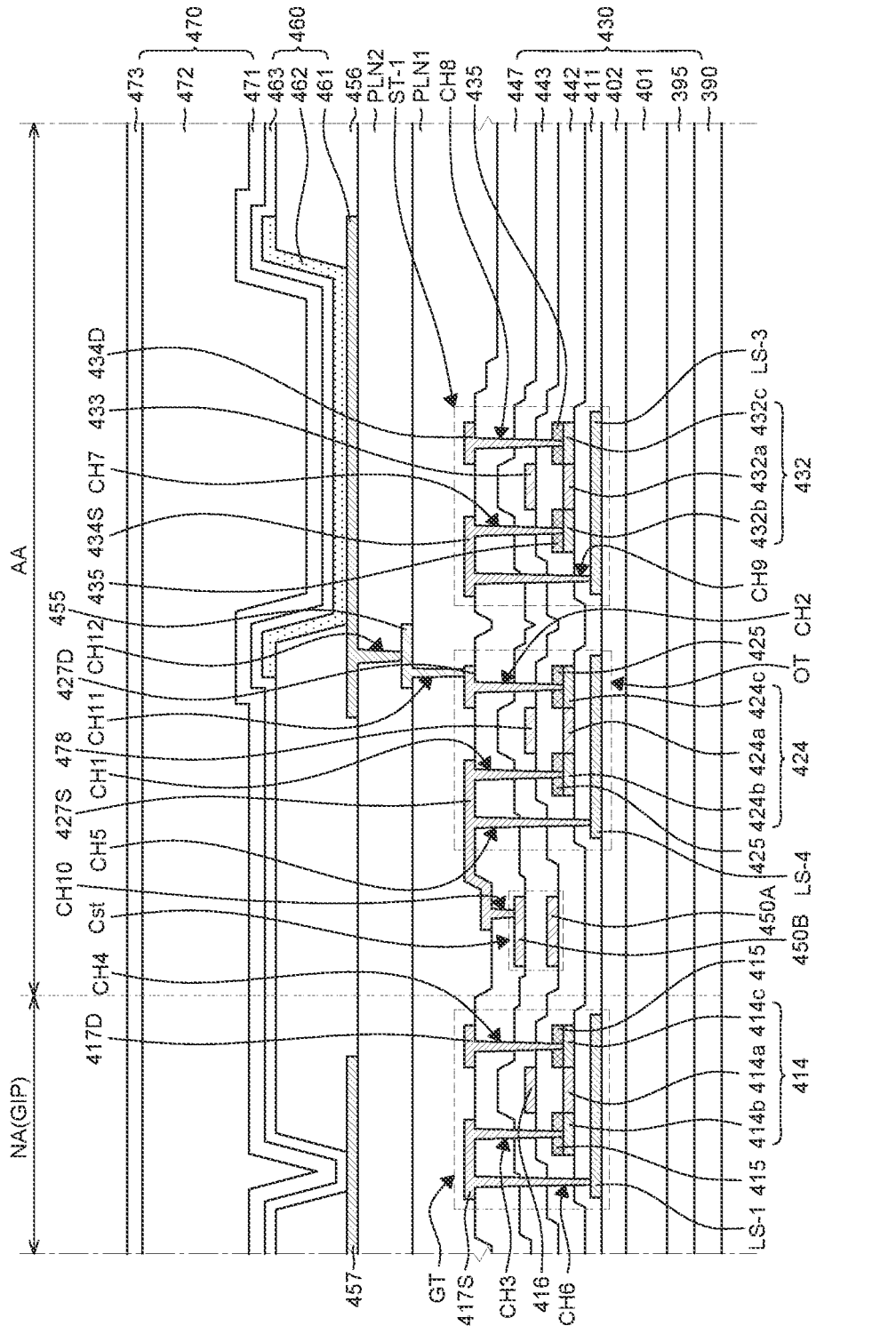
FIG. 5 is a cross-sectional view of a display apparatus according to still another exemplary embodiment of the present disclosure.

FIG. 5 is a cross-sectional view of a display apparatus according to another exemplary embodiment of the present disclosure.

In FIG. 5, it is illustrated that an oxide semiconductor pattern is used for a fourth thin film transistor OT which drives the sub pixel SP, a third thin film transistor ST-1 which is a switching transistor, and a first thin film transistor GT of the non-active area NA. The configuration of the third thin film transistor ST-1 of the active area AA may be the same as the exemplary embodiment of FIG. 3A. Accordingly, the description for the same configuration as the exemplary embodiment of FIG. 3A will be omitted.

In FIG. 5, the sub pixel SP of the active area AA may include a fourth thin film transistor OT which is one driving thin film transistor, and a third thin film transistor ST-1 which is at least one switching thin film transistor. Here, when one or more third thin film transistors ST-1 are provided, all the switching thin film transistors may also include an oxide semiconductor pattern, or may also be a hybrid type in which some includes an oxide semiconductor pattern and the others include a polycrystalline semiconductor pattern.

Among them, FIG. 5 illustrates a fourth thin film transistor OT which is a driving thin film transistor including an oxide semiconductor pattern, a third thin film transistor ST-1 which is a switching thin film transistor including an oxide semiconductor pattern, and a first thin film transistor GT including an oxide semiconductor pattern, as an example.

The first semiconductor layer 414, the fourth semiconductor layer 424, and the third semiconductor layer 432 included by the first thin film transistor GT, the fourth thin film transistor OT, and the third thin film transistor ST-1 are formed on the same layer. Accordingly, it is advantageous in that the first etch stopper 415, the second etch stopper 425, and the fourth etch stopper 435 are simultaneously formed by one mask.

Referring to FIG. 5, the fourth thin film transistor OT includes a fourth semiconductor pattern 424, a fourth gate electrode 478 overlapping the fourth semiconductor pattern 424, a fourth source electrode 427S, and a fourth drain electrode 427D.

The oxide semiconductor may be formed of an oxide of a metal, such as zinc (Zn), indium (In), gallium (Ga), tin (Sn), or titanium (Ti) or a combination of a metal, such as zinc (Zn), indium (In), gallium (Ga), tin (Sn), and titanium (Ti), or oxide thereof. To be more specific, the oxide semiconductor may include zinc oxide (ZnO), zinc-tin oxide (ZTO), zinc-indium oxide (ZIO), indium oxide (InO), titanium oxide (TiO), indium-gallium-zinc oxide (IGZO), or indium-zinc-tin oxide (IZTO).

In the exemplary embodiment of FIG. 3A, as the driving thin film transistor, a polycrystalline semiconductor pattern which is advantageous for a high speed operation is used as an active layer. However, the driving thin film transistor including the polycrystalline semiconductor pattern may have a problem in that a leakage current occurs in an off-state so that the power is consumed. For example, the problem in that the power consumption occurs in the off-state becomes more serious in a low speed operation such as a still image that the display apparatus displays a document screen. Accordingly, in another exemplary embodiment of FIG. 5 of the present disclosure, a driving thin film transistor which uses an oxide semiconductor pattern which blocks the generation of the leakage current as an active layer is proposed.

However, in the case of the thin film transistor which uses the oxide semiconductor pattern as an active layer, due to a characteristic of the material of the oxide semiconductor, a current change value is large with respect to a unit voltage change value so that a failure may occur in a low grayscale region in which precise current control is necessary. Accordingly, in the exemplary embodiment illustrated in FIG. 5, a driving thin film transistor in which the current change value in the active layer is relatively insensitive to the change value of the voltage applied to the gate electrode is proposed.

Further, the fourth semiconductor pattern 474 which is an active layer includes a fourth channel region 474a in which charges move, a fourth source region 474b and a fourth drain region 474c which are adjacent to the fourth channel region 474a with the fourth channel region 474a therebetween.

The fourth channel region 474a may be configured by an intrinsic oxide semiconductor in which the impurity is not doped. Further, the fourth source region 474b and the fourth drain region 474c may be a conductive region formed by doping an intrinsic oxide semiconductor with Group 3 or Group 5 impurity ions.

A fourth shield layer LS-4 is formed below the fourth semiconductor pattern 474. The fourth shield layer LS-4 may be a metal pattern BSM which blocks external light to suppress the erroneous operation of the fourth semiconductor pattern 474 caused due to external light which is irradiated onto the first oxide semiconductor pattern 474.

The fourth shield layer LS-4 may be a metal layer including a titanium (Ti) material having excellent ability to capture hydrogen particles. For example, the metal layer may be a titanium single layer or a double layer of molybdenum (Mo) and titanium (Ti), or an alloy of molybdenum (Mo) and titanium (Ti). However, it is not limited thereto, and another metal layer including titanium (Ti) is also possible.

Titanium (Ti) captures hydrogen particles diffusing into the second lower buffer layer 411 and suppresses the hydrogen particles from reaching the first oxide semiconductor pattern 474.

The fourth shield layer LS-4 may be formed vertically below the fourth semiconductor pattern 474 to overlap the fourth semiconductor pattern 474. Further, the fourth shield layer LS-4 may be formed to be larger than the fourth semiconductor pattern 474 to completely overlap the fourth semiconductor pattern 474.

The fourth source electrode 479S of the fourth thin film transistor OT may be electrically connected to the fourth shield layer LS-4. When the fourth shield layer LS-4 is electrically connected to the fourth source electrode 479S, an additional effect may be achieved as follows.

As the fourth source region 474b and the fourth drain region 474c are doped with impurities, a parasitic capacitance $C_{act}$ is generated in the fourth semiconductor pattern 474. Further, a parasitic capacitance $C_{gi}$ is generated between the fourth gate electrode 478 and the fourth semiconductor pattern 474. Furthermore, a parasitic capacitance $C_{buf}$ is generated between the fourth shield layer LS-4 which is electrically connected to the fourth source electrode 479S and the fourth semiconductor pattern 474.

The fourth semiconductor pattern 474 and the fourth shield layer LS-4 are electrically connected by the fourth source electrode 479S so that the parasitic capacitance $C_{act}$ and the parasitic capacitance $C_{buf}$ are connected in parallel each other, and the parasitic capacitance $C_{act}$ and the parasitic capacitance $C_{gi}$ are connected in series. Further, when the gate voltage $V_{gat}$ is applied to the fourth gate electrode 478, an effective voltage $V_{eff}$ which is actually applied to the fourth semiconductor pattern 474 establishes the following Equation 1.

$$\Delta V = Cgi/(Cgi+Cact+Cbuf) \times \Delta Vgat$$

Accordingly, the effective voltage $V_{eff}$ which is applied to the second channel region 474a is in inverse proportion to the parasitic capacitance $C_{buf}$, so that the effective voltage applied to the fourth semiconductor pattern 474 may be adjusted by adjusting the parasitic capacitance $C_{buf}$.

For example, when the fourth shield layer LS-4 is disposed to be close to the fourth semiconductor pattern 474 to increase the parasitic capacitance $C_{buf}$, an actual current value flowing through the fourth semiconductor pattern 474 may be reduced.

When the effective current value flowing through the fourth semiconductor pattern 474 is reduced, it means that an S-factor may be increased so that a controllable range of the driving thin film transistor DT which is controlled by the voltage $V_{gat}$ which is actually applied to the fourth gate electrode 478 is increased.

For example, when the fourth source electrode 479S of the fourth thin film transistor DT and the fourth shield layer LS-4 are electrically connected, the light emitting diode 460 may be precisely controlled even in a low gray scale level so that a problem of a screen burn-in which is generated in the low gray scale level may be solved.

For example, the s-factor is generally called "subthreshold slope", and indicates a voltage required to increase the current 10 times, and is a reciprocal number of a slope of a graph in a region equal to or lower than a threshold voltage in a graph I-V curve representing a characteristic of a drain current with respect to a gate voltage.

When the S-factor is small, it means that the slope of the characteristic graph I-V of the drain current to the gate voltage is large so that the thin film transistor is turned on even by a low voltage. Accordingly, the switching characteristic of the thin film transistor is improved. In contrast, it reaches a threshold voltage in a short time so that it may be difficult to represent a sufficient gray scale.

When the S-factor is large, it means that the slope of the characteristic graph I-V of the drain current to the gate voltage is small so that an on/off response speed of the thin film transistor is degraded. Therefore, the switching characteristic of the thin film transistor is degraded, but it reaches a threshold voltage for a relatively long time so that sufficient gray level expression may be possible.

The fourth shield layer LS-4 is disposed below the second lower buffer layer 411 to be close to the fourth semiconductor layer 474. In the exemplary embodiment of the present disclosure, a plurality of buffer layers may be used, but the present disclosure is not limited thereto.

The exemplary embodiments of the present disclosure can also be described as follows:

According to an aspect of the present disclosure, a display apparatus may include a substrate including an active area and a non-active area around the active area, a first shield layer disposed on the substrate, a first thin film transistor including a first semiconductor layer on the first shield layer, a first etch stopper on the first semiconductor layer, a second thin film transistor including a second semiconductor layer on the substrate, and a second etch stopper on the second semiconductor layer.

The first thin film transistor may be a driving thin film transistor, and the second thin film transistor may be a switching thin film transistor.

The first thin film transistor may be disposed in at least one of the active area and the non-active area, and the second thin film transistor may be disposed in the active area.

The first thin film transistor may further include a first gate electrode on the first etch stopper, and a first source electrode and a first drain electrode which pass through the first etch stopper to be connected to the first semiconductor layer, and the first shield layer may be connected to the first source electrode.

The display apparatus may further include a second shield layer between the substrate and the second semiconductor layer, the second thin film transistor further includes a second gate electrode on the second etch stopper, and a second source electrode and a second drain electrode which pass through the second etch stopper to be connected to the second semiconductor layer, and the second shield layer may be connected to the second source electrode.

The first gate electrode and the second gate electrode may be located on different layers from each other.

The first etch stopper may be configured by at least one of titanium nitride (TiN), titanium carbon (TiC), aluminum nitride (AlN), and titanium aluminum nitride (TiAlN).

The first semiconductor layer may include a first source region, a first drain region, and a first channel region located between the first source region and the first drain region, and the first etch stopper is disposed on the first source region and the first drain region, and may cover the first source region and the first drain region.

The second semiconductor layer may include a second source region, a second drain region, and a second channel region located between the second source region and the second drain region, and the second etch stopper is disposed above the second source region and the second drain region, and may cover the second source region and the second drain region.

The first etch stopper may include a contact hole having a smaller width than the first source region and the first drain region, and the first source electrode and the first drain electrode are in contact with the first source region and the first drain region through the contact hole, respectively.

The first semiconductor layer may be configured by a polycrystalline semiconductor layer.

The first shield layer may overlap the first semiconductor layer below the first semiconductor layer.

The second semiconductor layer may be configured by an oxide semiconductor layer.

A thickness of the second etch stopper may be larger than a thickness of the first etch stopper.

The display apparatus may further include a third thin film transistor which is disposed on the substrate and includes a third semiconductor layer configured by an oxide semiconductor layer, a third gate electrode, a third source electrode, and a third drain electrode, and a third shield layer overlapping the third semiconductor layer below the third semiconductor layer, a distance between the second semiconductor layer and the second shield layer may be shorter than a distance between the third semiconductor layer and the third shield layer.

The third source electrode and the third drain electrode may be configured by the same material as the first source electrode, the first drain electrode, the second source electrode, and the second drain electrode.

The display apparatus may further include a gate driving circuit which is disposed on the substrate in the non-active area, the gate driving circuit further includes at least one of contact holes and a third etch stopper.

The second shield layer may be a storage capacitor.

According to another aspect of the present disclosure, a display apparatus may include a substrate including an active area and a non-active area around the active area; a first shield layer disposed on the substrate; a first thin film transistor including a first semiconductor layer on the first shield layer, the first shield layer being connected to a source electrode of the first thin film transistor; a second thin film transistor including a second semiconductor layer on the substrate; a second shield layer between the substrate and the second semiconductor layer, the second shield layer being connected to a source electrode of the second thin film transistor; and a third thin film transistor disposed on the substrate and including a third semiconductor layer.

The display apparatus may further include a third shield layer overlapping the third semiconductor layer below the third semiconductor layer, wherein a distance between the second semiconductor layer and the second shield layer is shorter than a distance between the third semiconductor layer and the third shield layer.

The display apparatus may further include a third shield layer overlapping the third semiconductor layer below the third semiconductor layer, wherein the first semiconductor layer, the second semiconductor layer and the third semiconductor layer are formed on the same layer.

The first thin film transistor and the second thin film transistor may be driving thin film transistors, and the third thin film transistor may be a switching thin film transistor.

It will be appreciated that technical spirit of the present disclosure has been described herein for purposes of illustration by the above description and the accompanying drawings, and that various modifications or variations such as combination, separation, substitution, and change of components may be made by those skilled in the art without departing from the scope and spirit of the present disclosure. Therefore, the exemplary embodiments of the present disclosure are provided for illustrative purposes only but not intended to limit the technical concept of the present disclosure. The scope of the technical concept of the present disclosure is not limited thereto. The protection scope of the present disclosure should be interpreted based on the following appended claims and it should be appreciated that all technical spirits included within a range equivalent thereto are included in the protection scope of the present disclosure.

What is claimed is:

1. A display apparatus, comprising:
   a substrate including an active area and a non-active area around the active area;
   a first shield layer on the substrate;
   a first thin film transistor including a first semiconductor layer that is on the first shield layer;
   a first etch stopper on the first semiconductor layer;
   a second thin film transistor including a second semiconductor layer that is on the substrate; and
   a second etch stopper on the second semiconductor layer,
   wherein the first thin film transistor further includes:
      a first gate electrode on the first etch stopper, and
      a first source electrode and a first drain electrode that pass through the first etch stopper and are connected to the first semiconductor layer, and
   wherein the first shield layer is connected to the first source electrode.

2. The display apparatus according to claim 1, wherein the first thin film transistor is a driving thin film transistor, and the second thin film transistor is a switching thin film transistor.

3. The display apparatus according to claim 1, wherein the first thin film transistor is in one of the active area or the non-active area, and the second thin film transistor is in the active area.

4. The display apparatus according to claim 1, wherein the first etch stopper comprises at least one of titanium nitride, titanium carbon, aluminum nitride, or titanium aluminum nitride.

5. The display apparatus according to claim 1, wherein the second semiconductor layer includes a second source region, a second drain region, and a second channel region located between the second source region and the second drain region, and the second etch stopper is above the second source region and the second drain region, and covers the second source region and the second drain region.

6. The display apparatus according to claim 1, wherein the first semiconductor layer comprises a polycrystalline semiconductor layer.

7. The display apparatus according to claim 1, wherein the first shield layer overlaps the first semiconductor layer and is below the first semiconductor layer.

8. The display apparatus according to claim 1, wherein the second semiconductor layer comprises an oxide semiconductor layer.

9. The display apparatus according to claim 1, wherein a thickness of the second etch stopper is larger than a thickness of the first etch stopper.

10. The display apparatus according to claim 1, further comprising:
   a gate driving circuit on the substrate in the non-active area, the gate driving circuit including at least one of contact holes and a third etch stopper.

11. The display apparatus according to claim 1, wherein the first semiconductor layer includes a first source region, a first drain region, and a first channel region located between the first source region and the first drain region, and the first etch stopper is on the first source region and the first drain region, and covers the first source region and the first drain region.

12. The display apparatus according to claim 11, wherein the first etch stopper includes a contact hole having a width that is smaller than the first source region and the first drain region, and the first source electrode and the first drain electrode are in contact with the first source region and the first drain region through the contact hole, respectively.

13. The display apparatus according to claim 1, further comprising:
   a second shield layer between the substrate and the second semiconductor layer,
   wherein the second thin film transistor further includes:

a second gate electrode on the second etch stopper; and a second source electrode and a second drain electrode which pass through the second etch stopper and are connected to the second semiconductor layer, and the second shield layer is connected to the second source electrode.

14. The display apparatus according to claim 13, wherein the second shield layer is a storage capacitor.

15. The display apparatus according to claim 13, wherein the first gate electrode and the second gate electrode are located on different layers from each other.

16. The display apparatus according to claim 13, further comprising:

a third thin film transistor on the substrate, the third thin film transistor including a third semiconductor layer comprising an oxide semiconductor layer, a third gate electrode, a third source electrode, and a third drain electrode; and a third shield layer overlapping the third semiconductor layer and below the third semiconductor layer, wherein a distance between the second semiconductor layer and the second shield layer is less than a distance between the third semiconductor layer and the third shield layer.

17. The display apparatus according to claim 16, wherein the third source electrode and the third drain electrode comprise a same material as the first source electrode, the first drain electrode, the second source electrode, and the second drain electrode.

18. A display apparatus, comprising:

a substrate including an active area and a non-active area around the active area;

a first shield layer on the substrate;

a first thin film transistor including a first semiconductor layer on the first shield layer and a source electrode of the first thin film transistor, the first shield layer connected to the source electrode of the first thin film transistor;

a second thin film transistor including a second semiconductor layer on the substrate and a source electrode of the second thin film transistor;

a second shield layer between the substrate and the second semiconductor layer, the second shield layer being connected to the source electrode of the second thin film transistor; and a third thin film transistor on the substrate, the third thin film transistor including a third semiconductor layer.

19. The display apparatus according to claim 18, further comprising:

a third shield layer overlapping the third semiconductor layer and below the third semiconductor layer, wherein a distance between the second semiconductor layer and the second shield layer is less than a distance between the third semiconductor layer and the third shield layer.

20. The display apparatus according to claim 18, further comprising:

a third shield layer overlapping the third semiconductor layer and below the third semiconductor layer, wherein the first semiconductor layer, the second semiconductor layer, and the third semiconductor layer are on a same layer.

21. The display apparatus according to claim 18, wherein the first thin film transistor and the second thin film transistor are driving thin film transistors, and the third thin film transistor is a switching thin film transistor.

* * * * *